United States Patent
Lee

(10) Patent No.: US 8,466,015 B2
(45) Date of Patent: Jun. 18, 2013

(54) THIN FILM TRANSISTORS IN PIXEL AND DRIVING PORTIONS CHARACTERIZED BY SURFACE ROUGHNESS

(75) Inventor: Hong-Ro Lee, Suwon-si (KR)

(73) Assignee: Samsung Display Co., Ltd., Yongin (KR)

( * ) Notice: Subject to any disclaimer, the term of this patent is extended or adjusted under 35 U.S.C. 154(b) by 17 days.

(21) Appl. No.: 13/329,191

(22) Filed: Dec. 16, 2011

(65) Prior Publication Data

US 2012/0088346 A1 Apr. 12, 2012

Related U.S. Application Data

(62) Division of application No. 11/954,716, filed on Dec. 12, 2007, now Pat. No. 8,097,883.

(30) Foreign Application Priority Data

Dec. 19, 2006 (KR) .................. 10-2006-0130186

(51) Int. Cl.
  *H01L 21/84* (2006.01)
  *H01L 27/12* (2006.01)
  *H01L 29/04* (2006.01)

(52) U.S. Cl.
  CPC ............ *H01L 27/12* (2013.01); *H01L 27/1214* (2013.01); *H01L 29/04* (2013.01)
  USPC ............................ 438/166; 438/487; 438/489

(58) Field of Classification Search
  USPC ................. 438/166, 478, 486, 487, 488, 489, 438/FOR. 393, FOR. 478; 257/49, 64, 66, 257/75, E21.12, E21.297, E21.316
  See application file for complete search history.

(56) References Cited

U.S. PATENT DOCUMENTS

| | | | |
|---|---|---|---|
| 5,569,610 A * | 10/1996 | Zhang et al. | 438/166 |
| 5,969,377 A | 10/1999 | Seo | |
| 6,559,477 B2 | 5/2003 | Tada et al. | |
| 6,969,871 B2 | 11/2005 | Yamaguchi et al. | |
| 2003/0109085 A1* | 6/2003 | Yamazaki et al. | 438/148 |
| 2005/0070035 A1* | 3/2005 | Yazaki et al. | 438/22 |
| 2011/0140110 A1* | 6/2011 | Fujikawa | 257/57 |

FOREIGN PATENT DOCUMENTS

KR 1020040041074 5/2004
KR 1020040057968 7/2004

OTHER PUBLICATIONS

Non-Final Office Action issued on Aug. 21, 2009 in U.S. Appl. No. 11/954,716.
Final Office Action issued on Feb. 4, 2010 in U.S. Appl. No. 11/954,716.
Non-Final Office Action issued on Jun. 1, 2010 in U.S. Appl. No. 11/954,716.

(Continued)

*Primary Examiner* — Olik Chaudhuri
*Assistant Examiner* — Quovaunda Jefferson
(74) *Attorney, Agent, or Firm* — H.C. Park & Associates, PLC

(57) ABSTRACT

A thin film transistor and a fabrication method thereof, in which one excimer laser annealing (ELA) makes a pixel portion and a driver portion different from each other in surface roughness and grain size. The thin film transistor includes: a substrate including a pixel portion and a driver portion; a first semiconductor layer disposed in the pixel portion and having a first surface roughness; and a second semiconductor layer disposed in the driver portion and having a second surface roughness smaller than the first surface roughness.

15 Claims, 10 Drawing Sheets

OTHER PUBLICATIONS

Final Office Action issued on Oct. 15, 2010 in U.S. Appl. No. 11/954,716.
Non-Final Office Action issued on Apr. 4, 2011 in U.S. Appl. No. 11/954,716.
Notice of Allowance issued on Oct. 6, 2011 in U.S. Appl. No. 11/954,716.
Notice of Allowance issued on Apr. 16, 2008 in Korean Patent Application No. 2006-130186.

* cited by examiner

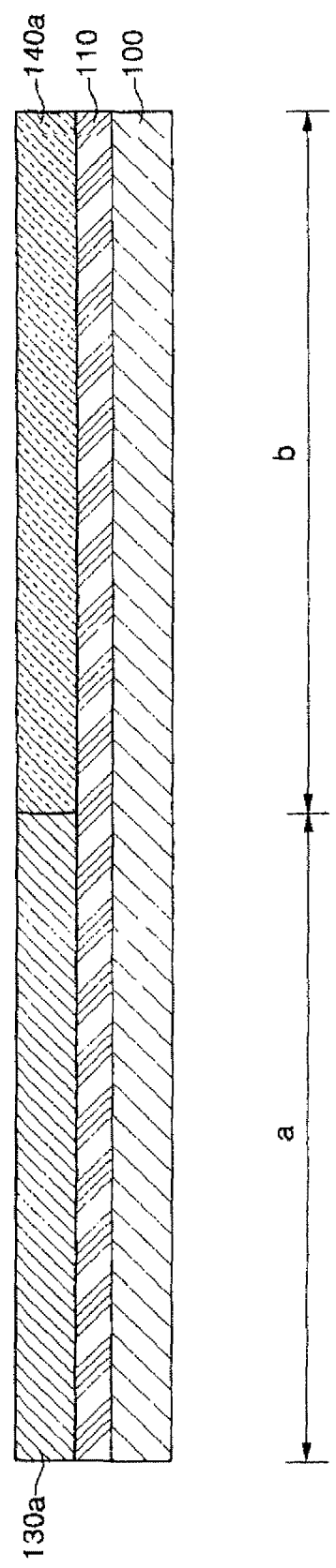

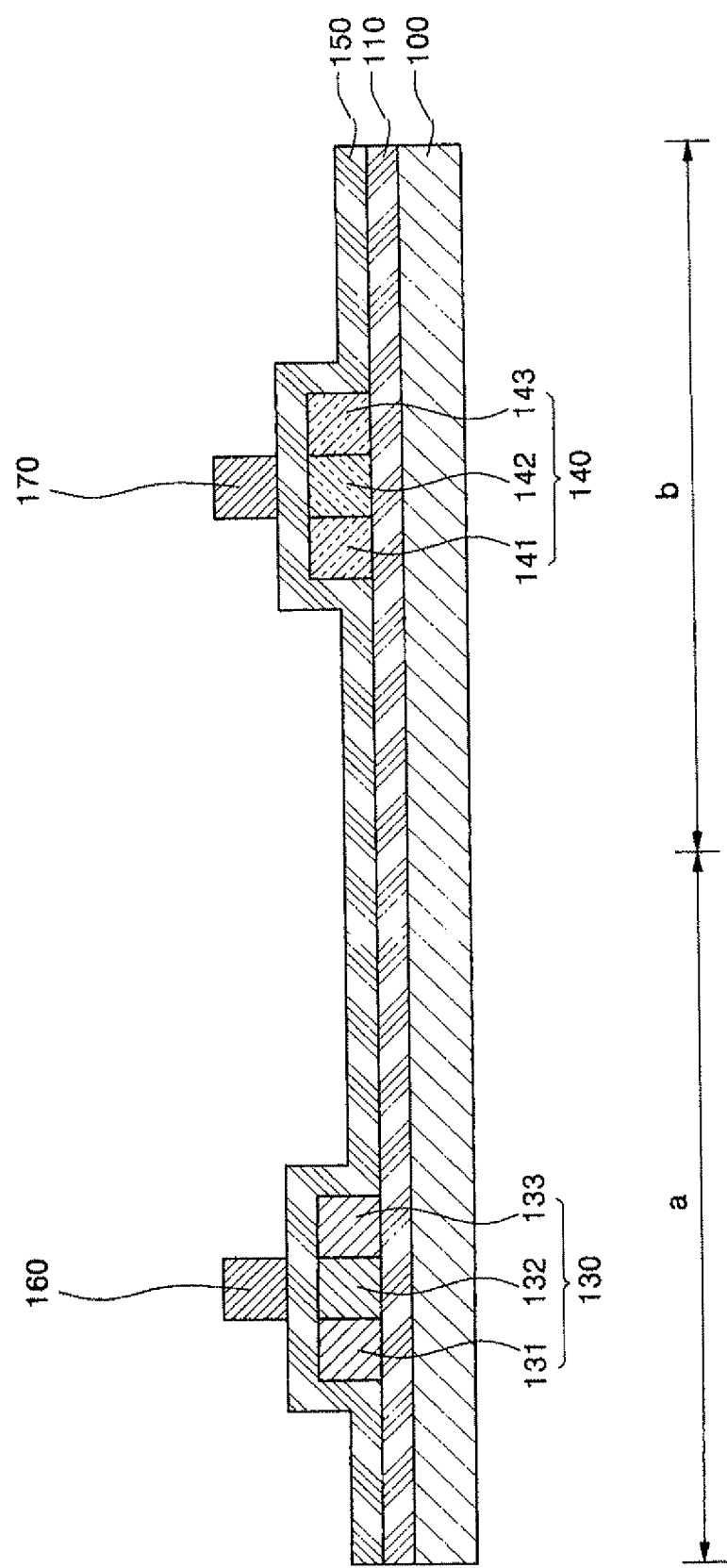

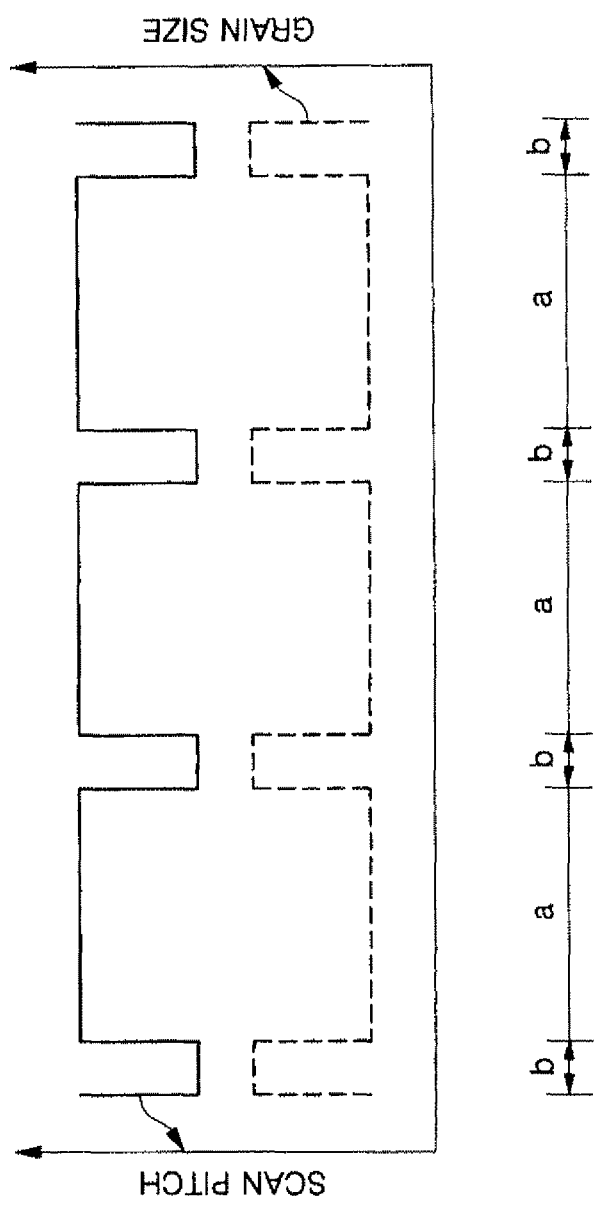

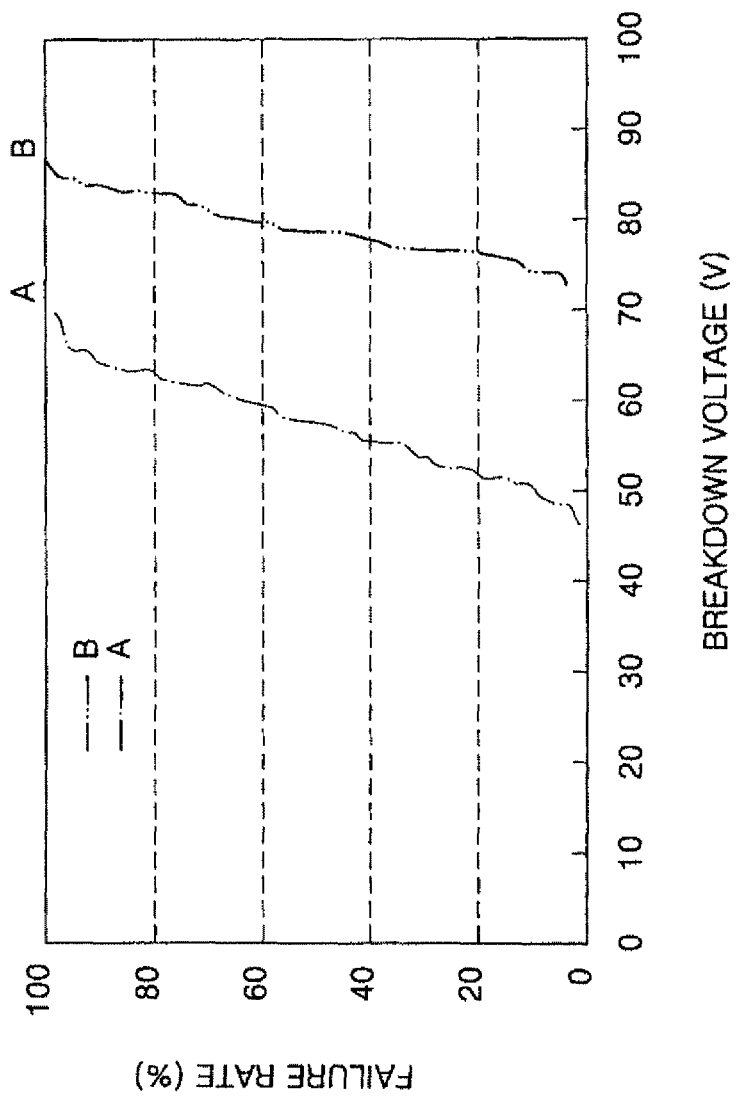

THIN FILM TRANSISTORS IN PIXEL AND DRIVING PORTIONS CHARACTERIZED BY SURFACE ROUGHNESS

CROSS-REFERENCE TO RELATED APPLICATION

This application is a divisional of U.S. patent application Ser. No. 11/954,716, filed on Dec. 12, 2007 and claims priority from and the benefit of Korean Application No. 10-2006-0130186, filed Dec. 19, 2006, in the Korean Intellectual Property Office, which are hereby incorporated by reference for all purposes as if fully set forth herein.

BACKGROUND OF THE INVENTION

1. Field of the Invention

An aspect of the present invention relates to a thin film transistor and a fabrication method thereof, and more particularly, to a thin film transistor and a fabrication method thereof in which one excimer laser annealing (ELA) makes a pixel portion and a driver portion different from each other in surface roughness and grain size of a semiconductor layer.

2. Description of the Related Art

Many kinds of display devices are used for displaying an image. Recently, various flat panel display devices have been developed as alternatives to a Braun tube (i.e., a cathode ray tube). Such flat panel display devices are divided into emissive and non-emissive display device types, according to light emission characteristics. For example, an emissive display device includes a plasma display panel (PDP), an organic light emitting display device (OLED), etc., and a non-emissive display device includes a liquid crystal display device (LCD), etc.

The LCD and OLED are divided into active and passive types according to whether a thin film transistor is needed as a driving device. In the active display device, an amorphous silicon layer and a polycrystalline silicon layer may be used in a semiconductor layer of the thin film transistor.

Particularly, a pixel portion and a driver portion of the active OLED are different from each other in a required characteristic of the thin film transistor. For instance, the required characteristic of the thin film transistor in the driver portion is high electron mobility, but the required characteristic of the thin film transistor in the pixel portion is focused on uniform brightness.

Conventionally, to make the thin film transistor have different characteristics, the pixel portion uses an amorphous silicon layer for the thin film transistor, but the driver portion employs a polycrystalline silicon layer which is formed by laser beam annealing or the like for the semiconductor layer of the thin film transistor. However, in this case, the electron mobility is so low that it is difficult to drive the pixel portion. To solve this problem, annealing such as solid phase crystallization (SPC), metal induced lateral crystallization (MILC), metal induced crystallization (MIC), metal induced crystallization using a cap layer (MICC), or the like is applied to the pixel portion, and laser annealing such as excimer layer annealing (ELA), sequential lateral solidification (SLS), or the like is applied to the driver portion. However, since the annealed polycrystalline silicon layer has a number of defects in a crystal grain, a lot of leakage current is generated and the crystal grain decreases in uniformity, making it difficult to display an image with uniform brightness. Further, not only does it take a lot of time to perform the annealing, but also an additional process such as the laser annealing causes a fabricating process to become complicated. Even though only the ELA is used to make a crystal grain size of the semiconductor layer different between the pixel portion and the driver portion, both the pixel portion and the driver portion are fully scanned once, and then only the driver portion is scanned once again. Therefore, the time taken to move a stage is lengthened, thereby increasing a processing time.

SUMMARY OF THE INVENTION

An aspect of the present invention provides a thin film transistor and a fabricating method thereof, in which one excimer laser annealing (ELA) makes a pixel portion and a driver portion different from each other in surface roughness and grain size of a semiconductor layer.

According to an aspect of the present invention, a thin film transistor includes a substrate having a pixel portion and a driver portion; a first semiconductor layer disposed in the pixel portion and having a first surface roughness; a second semiconductor layer disposed in the driver portion and having a second surface roughness larger than the first surface roughness; a first gate electrode disposed to correspond to the first semiconductor layer; a second gate electrode disposed to correspond to the second semiconductor layer; a gate insulating layer disposed between the first and second semiconductor layers and the first and second gate electrodes; first source and drain electrodes electrically connected to source and drain regions of the first semiconductor layer; and second source and drain electrodes electrically connected to source and drain regions of the second semiconductor layer.

According to an aspect of the present invention, a method of fabricating a thin film transistor includes: providing a substrate including a pixel portion and a driver portion; forming an amorphous silicon layer on the substrate; forming a polycrystalline silicon layer by sequentially scanning a laser beam on the amorphous silicon layer in the pixel portion while moving the laser beam at a first scan pitch; forming a polycrystalline silicon layer by sequentially scanning the laser beam on the amorphous silicon layer in the driver portion while moving the laser beam at a second scan pitch smaller than the first scan pitches; patterning the polycrystalline silicon layer to form a first semiconductor layer having a first surface roughness in the pixel portion and a second semiconductor layer having a second surface roughness smaller than the first surface roughness in the driver portion; forming a gate insulating layer on the entire surface of the substrate including the first and second semiconductor layers; forming first and second gate electrodes on the gate insulating layer to correspond to the first and second semiconductor layers; forming first and second source and drain regions by implanting an impurity ion into the first and second semiconductor layers; forming an interlayer insulating layer on the entire surface of the substrate including the first and second gate electrodes; and forming first and second source and drain electrodes on the interlayer insulating layer, the first and second source and drain electrodes being electrically connected with the first and second source and drain regions, respectively.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which:

FIGS. 1A through 1D are cross-sectional views illustrating a fabrication method of a thin film transistor according to an exemplary embodiment of the present invention;

FIG. 2B is a graph showing the relationship between a scan pitch and a grain size in the pixel and driver portions of FIG. 2A;

FIG. 6 is a graph showing a failure rate of a thin film transistor, which is measured with respect to a breakdown voltage depending on a root mean square (RMS) of surface roughness in a semiconductor layer of the thin film transistor according to an exemplary embodiment of the present invention.

DETAILED DESCRIPTION OF THE EMBODIMENTS

Figure 1A:
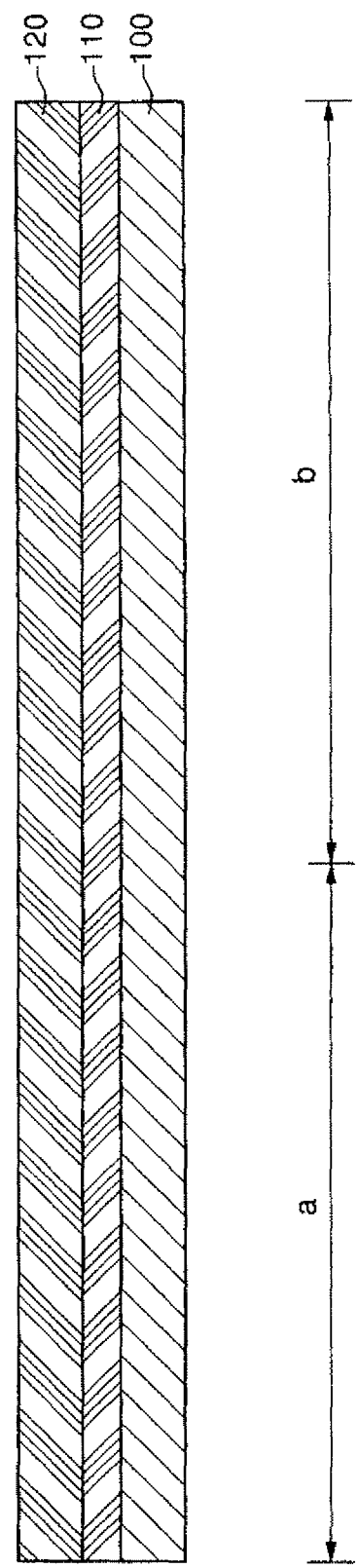

A reference will now be made in detail to the present embodiments of the present invention, examples of which are illustrated in the accompanying drawings, wherein like reference numerals refer to the like elements throughout. The embodiments are described below in order to explain the present invention by referring to the figures.

FIGS. 1A through 1D are cross-sectional views illustrating a fabrication method of a thin film transistor according to an exemplary embodiment of the invention.

Referring to FIG. 1A, a substrate 100 including a pixel portion (a) and a driver portion (b) is prepared, and a buffer layer 110 is formed on the substrate 100. Here, the substrate 100 may be made of glass, stainless steel, plastic, or the like, and the buffer layer 110 may be made of a silicon nitride layer, a silicon oxide layer or a multi layer of the silicon nitride layer and the silicon oxide layer. Further, the buffer layer 110 prevents moisture or impurities of a lower substrate from diffusing, and regulates a heat transfer rate during crystallization, thereby facilitating the crystallization of a semiconductor layer in the following process.

Then, an amorphous silicon layer 120 is deposited on the buffer layer 110 by a chemical vapor deposition (CVD) or physical vapor deposition (PVD) method.

Referring to FIG. 1B, the amorphous silicon layer 120 disposed above the pixel portion (a) is crystallized into a first polycrystalline silicon layer 130a having a first surface roughness. Further, the amorphous silicon layer 120 placed above the driver portion (b) is crystallized into a second polycrystalline silicon layer 140a having a second surface roughness.

Here, a root mean square (RMS) ratio of the first surface roughness to the second surface roughness is 25~90%. If the RMS ratio of the first surface roughness to the second surface roughness is more than 90%, the surface roughness of the semiconductor layer is so large that a breakdown voltage is lowered, thereby decreasing the reliability of a product, and also, streaks may occur on an image. Thus, 90% of the RMS of the second surface roughness should be 300 Å or less, because the reliability of the thin film transistor is secured under a condition in which the surface roughness of the semiconductor layer is less than 300 Å.

On the other hand, if the RMS ratio of the first surface roughness to the second surface roughness is less than 25%, a problem arises in that the capacitance of a capacitor decreases (not shown in the drawings). Generally, a doped polycrystalline semiconductor layer is used as a lower electrode of the capacitor. If the surface roughness of the semiconductor layer decreases, the surface area of the semiconductor layer also decreases and thus the capacitance of the capacitor per unit area decreases. To increase the capacitance of the capacitor, the surface area of the capacitor should be increased. However, because a pixel area is limited, the surface area of the capacitor is also limited. As a result, the capacitance of the capacitor decreases.

In the present exemplary embodiment, the first surface roughness is of 18~270 Å, and the second surface roughness is of 20~300 Å. This limitation is based on the foregoing description.

The amorphous silicon layer 120 is crystallized by excimer laser annealing (ELA) while being scanned by a laser beam with different scan pitches. For instance, the laser beam scans the amorphous silicon layer 120 corresponding to the pixel portion (a) at a first scan pitch S1, and sequentially scans the amorphous silicon layer 120 corresponding to the driver portion (b) at a second scan pitch S2. Therefore, a polycrystalline silicon layer formed in the pixel portion (a) is different in grain size from that formed in the driver portion (b).

Because the pixel portion and the driver portion are different from each other in required characteristics of the thin film transistor, they are also different in required grain size of the thin film transistor. For example, the semiconductor layer in the driver portion has to have a large-sized grain for high electron mobility, but the semiconductor layer in the pixel portion has to have a uniform grain size for uniform brightness. To crystallize the pixel portion and the driver portion by one scanning process while satisfying the aforementioned conditions, the first scan pitch S1 for the pixel portion is preferably 1.25~7.5% of the width of the laser beam used in the ELA. If the first scan pitch S1 is less than 1.25% of the width of the laser beam, the surface roughness of the polycrystalline silicon layer is so large that the breakdown voltage is lowered, thereby decreasing the reliability of a product. On the other hand, if the first scan pitch S1 is more than 7.5% of the width of the laser beam, the laser beam is not sufficiently overlapped, so that the streaks may occur on an image.

Here, the length of the laser beam used in the ELA may vary according to equipment or the cells disposed on the substrate, and therefore, the length of the laser beam is not limited to the examples described in the present embodiment. For example, the width of the laser beam is 350~450 μm, and in this embodiment, the laser beam has a width of 400 μm.

If the width of the laser beam is 400 μm, the first scan pitch S1 is preferably 5~30 μm (1.25~7.5% of the width of the laser beam). This limitation refers to the foregoing description. More preferably, the first scan pitch S1 is 10~20 μm to make the thin film transistor in the pixel portion have a preferable grain size of 250~350 μm uniformly.

Meanwhile, the driver portion (b) needs a more overlapped laser beam than that of the pixel portion (a) in order to get a large sized grain. Accordingly, the second scan pitch S2 is preferably 4~24 μm, that is, 10~80% of the first scan pitch S1. This limitation on the second scan pitch S2 is based on the same reason as that on the first scan pitch S1. However, the second scan pitch S2 should be 4 µm or more, otherwise if the second scan pitch S2 is less than 4 µm, the surface roughness of the polycrystalline silicon layer is so large that the reliability decreases and an aspect of the present invention is ineffective.

The first and second scan pitches S1 and S2 depend on a stage moving speed and an oscillation frequency of the laser beam. More specifically, the stage moving speed divided by the oscillation frequency of the laser beam equals to the scan pitch. The stage moving speed and the oscillation frequency of the laser beam are not specifically limited but have to satisfy the foregoing limitation of the first and second scan pitches S1 and S2.

Referring to FIG. 1C, the polycrystalline silicon layers 130a and 140a are patterned to form a first semiconductor layer 130 having the first surface roughness in the pixel portion a and a second semiconductor layer 140 having the second surface roughness in the driver portion b.

A gate insulating layer 150 is formed on the entire surface of the substrate including the first and second semiconductor layers 130 and 140. The gate insulating layer 150 includes a silicon nitride layer, a silicon oxide layer, or a multi layer of the silicon nitride layer and the silicon oxide layer.

First and second gate electrodes 160 and 170 are formed on the gate insulating layer 150 to correspond to the first and second semiconductor layers 130 and 140. The first and second gate electrodes 160 and 170 include one selected from the group consisting of aluminum (Al), an aluminum (Al) alloy, molybdenum (Mo), and a molybdenum (Mo) alloy. Preferably, the first and second gate electrodes 160 and 170 include a molybdenum-tungsten (MoW) alloy.

An ion-doping process is performed using the first and second gate electrodes 160 and 170 as masks, thereby forming first source and drain regions 131 and 133 of the first semiconductor layer 130, and second source and drain regions 141 and 143 of the second semiconductor layer 140.

Figure 1D:
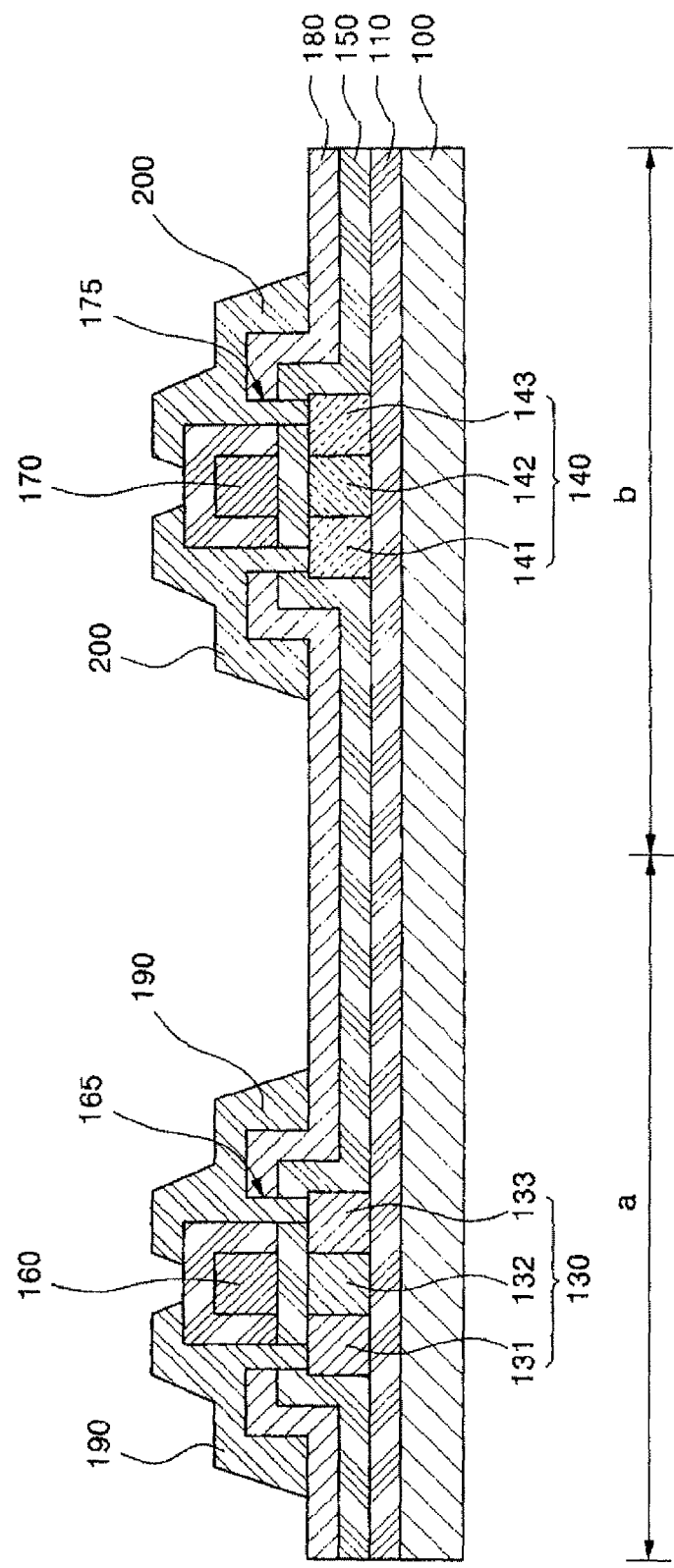

Referring to FIG. 1D, an interlayer insulating layer 180 is formed on the entire surface of the substrate including the first and second gate electrodes 160 and 170. Here, the interlayer insulating layer 180 includes a silicon nitride layer, a silicon oxide layer, or a multi layer of the silicon nitride layer and the silicon oxide layer.

By etching the interlayer insulating layer 180, contact holes 165 and 175 are formed to expose the first and second source and drain regions 131, 133, 141 and 143. Then, first and second source and drain electrodes 190 and 200 are formed to be connected with the first and second source and drain regions 131, 133, 141 and 143 through the contact holes 165 and 175. Here, the source and drain electrodes 190 and 200 may be formed of one selected from the group consisting of molybdenum (Mo), tungsten (W), molybdenum-tungsten (MoW), tungsten silicide ($WSi_2$), molybdenum silicide ($MoSi_2$), and aluminum (Al) and/or combinations thereof. Thus, the thin film transistor is completed by the crystallization according to the exemplary embodiment of the present invention.

Figure 2A:
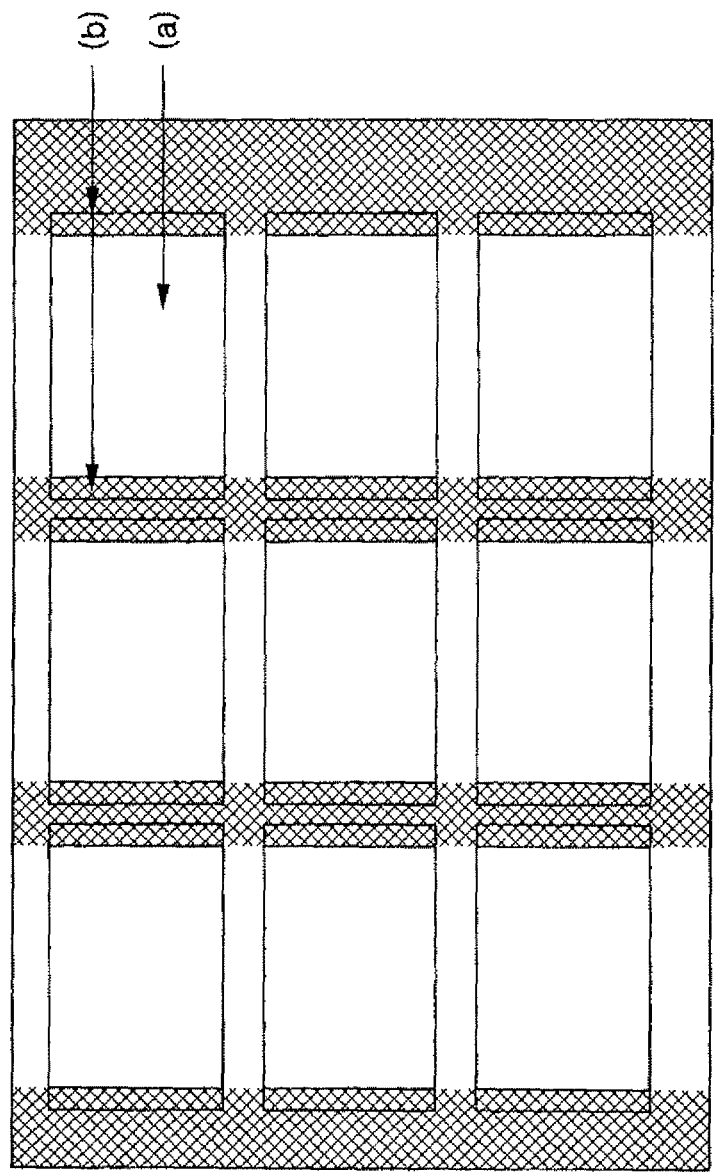
FIG. 2A is a plan view of a polycrystalline silicon layer in a pixel portion and a driver portion crystallized according to an exemplary embodiment of the present invention.

FIG. 2A is a plan view of a polycrystalline silicon layer in a pixel portion and a driver portion crystallized according to an exemplary embodiment of the present invention, and FIG. 2B is a graph showing the relationship between a scan pitch and a grain size in the pixel and driver portions of FIG. 2A.

Referring to FIGS. 2A and 2B, the pixel portion (a) and the driver portion (b) are formed on the substrate, in which the scan pitch of the pixel portion is larger than that of the driver portion. Further, in an area where the scan pitch is large, the grain size is small. On the other hand, in an area where the scan pitch is small, the grain size is large. Thus, the relationship between the scan pitch and the grain size is as follows: the grain size decreases as the scan pitch increases, and the grain size increases as the scan pitch decreases.

Figure 3:
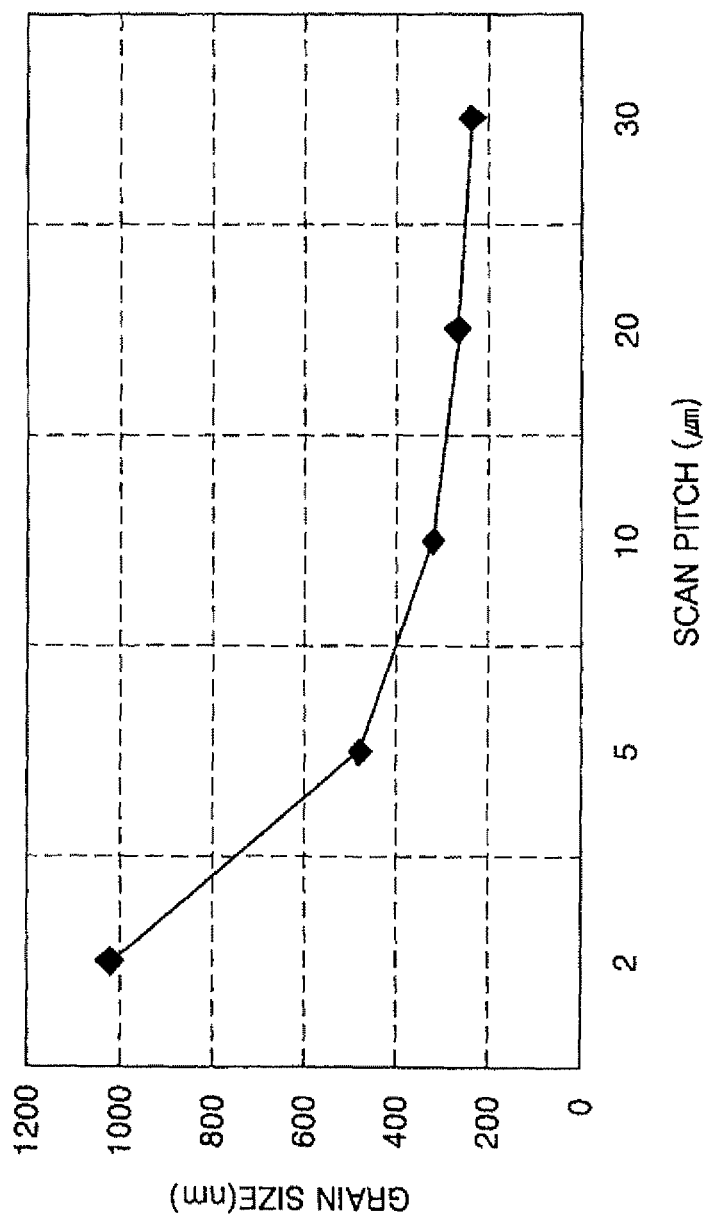
FIG. 3 is a graph showing the relationship between a scan pitch and a grain size according to an exemplary embodiment of the present invention.

FIG. 3 is a graph showing the relationship between a scan pitch and a grain size according to an exemplary embodiment of the present invention, in which a horizontal axis denotes a scan pitch (µm), and a vertical axis denotes a grain size (nm).

Referring to FIG. 3, the grain size is about 1000 nm when the scan pitch is 2 µmm, the grain size is about 500 nm when the scan pitch is 5 µm, the grain size is about 300 nm when the scan pitch is 10 µmm, the grain size is about 250 nm when the scan pitch is 20 µmm, and the grain size is about 200 nm when the scan pitch is 30 µm. Thus, the more the scan pitch decreases, the more the grain size increases. Alternatively, the more the scan pitch increases, the more the gain size decreases.

Figure 4:
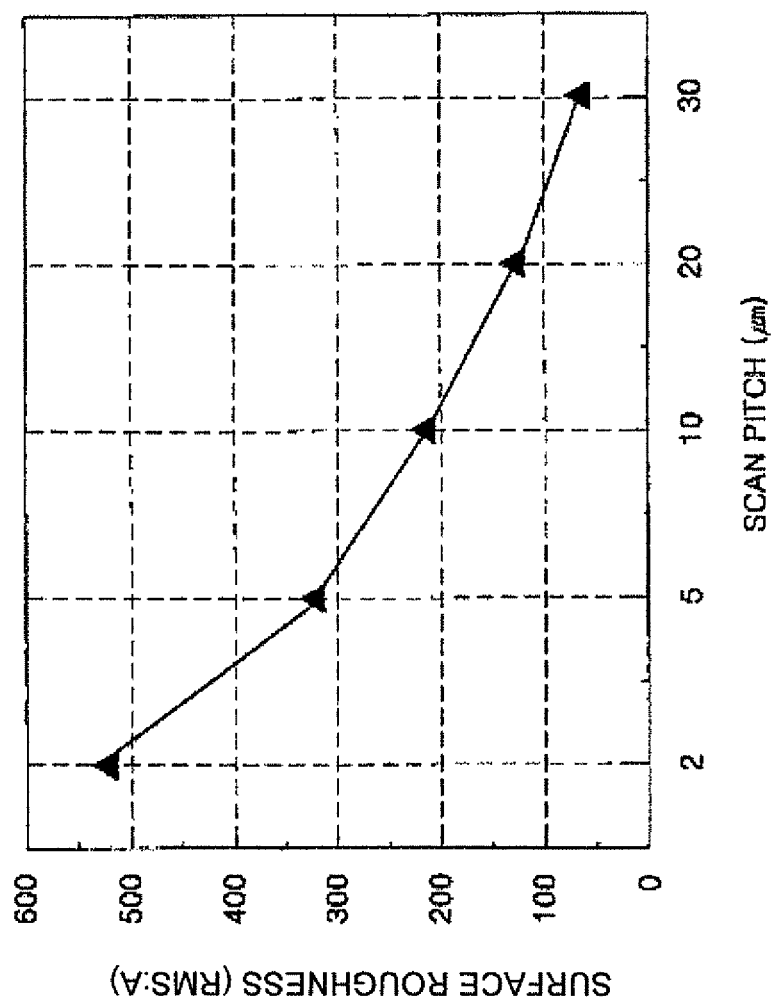
FIG. 4 is a graph showing the relationship between a scan pitch and a root mean square (RMS) of surface roughness according to an exemplary embodiment of the present invention.

FIG. 4 is a graph showing the relationship between a scan pitch and a root mean square (RMS) of surface roughness according to an exemplary embodiment of the present invention, in which a horizontal axis denotes a scan pitch (µm), and a vertical axis denotes an RMS of surface roughness (A).

Referring to FIG. 4, the RMS of surface roughness is about 500 Å when the scan pitch is 2 µm, the RMS of surface roughness is about 300 Å when the scan pitch is 5 µmm, the RMS of surface roughness is about 200 Å when the scan pitch is 10 µmm, the RMS of surface roughness is about 120 Å when the scan pitch is 20 µmm, and the RMS of surface roughness is about 60 Å when the scan pitch is 30 µmm. Thus, it is possible to get a preferable surface roughness of 20~300 Å (RMS) when the scan pitch ranges from 5 µm to 30 µmm.

Figure 5:
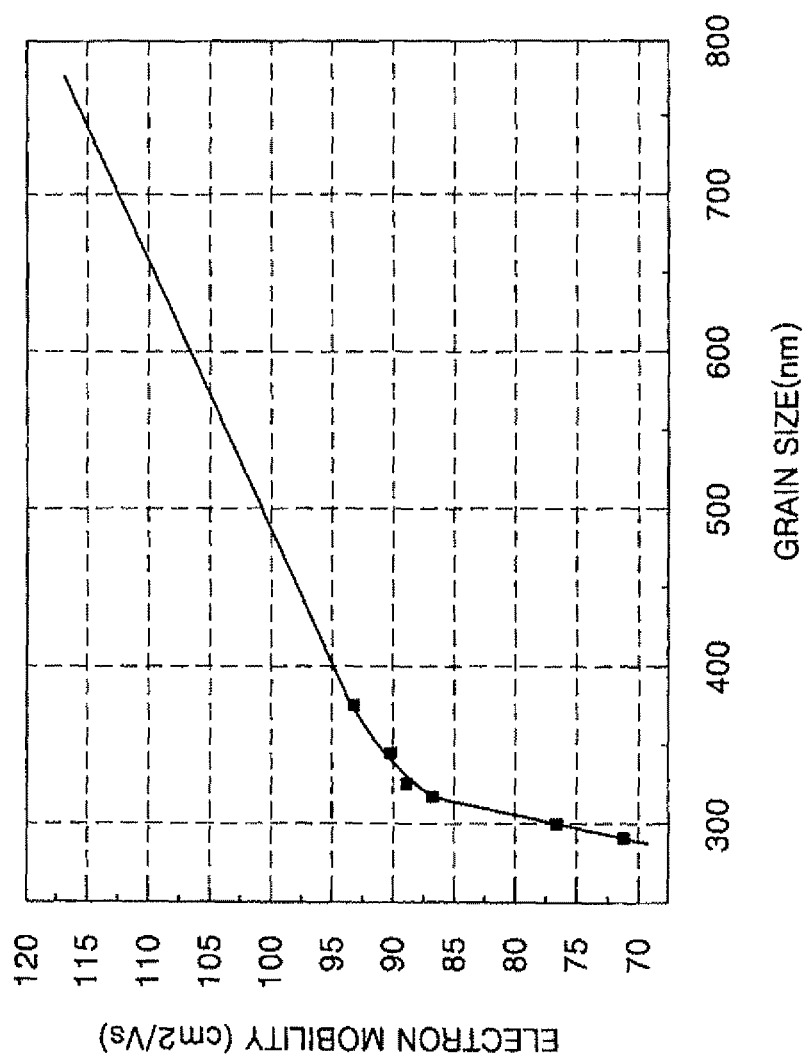
FIG. 5 is a graph showing the relationship between a grain size and electron mobility according to an exemplary embodiment of the present invention.

FIG. 5 is a graph showing the relationship between a grain size and electron mobility according to an exemplary embodiment of the present invention, in which a horizontal axis denotes a grain size (nm), and a vertical axis denotes electron mobility ($cm^2/Vs$).

Referring to FIG. 5, the electron mobility rapidly increases from about 70 $cm^2/Vs$ to about 93 $cm^2/Vs$ when the grain size is about 300~400 nm, and slowly increases when the grain size is more than 400 nm.

FIG. 6 is a Weibull plot, i.e., a graph showing a failure rate of a thin film transistor, which is measured with respect to a breakdown voltage depending on a root mean square (RMS) of surface roughness in a semiconductor layer of the thin film transistor according to an exemplary embodiment of the present invention, in which a horizontal axis denotes a breakdown voltage (V), and a vertical axis denotes a failure rate (%).

Referring to FIG. 6, in the thin film transistor A having a surface roughness of 200 Å (RMS), a breakdown voltage is about 56V when the failure rate is 40%, a breakdown voltage is about 57V when the failure rate is 50%, and a breakdown voltage is about 60V when the failure rate is 60%. In the Weibull plot, a representative breakdown voltage is generally determined when the failure rate is 50%. Thus, the thin film transistor A has a breakdown voltage of 57V.

Further, in the thin film transistor B having a surface roughness 130 Å (RMS), a breakdown voltage is about 77V when a failure rate is 40%, a breakdown voltage is about 78V when a failure rate is 50%, and a breakdown voltage is about 80V when a failure rate is 60%. Likewise, in the Weibull plot, a representative breakdown voltage is generally determined when the failure rate is 50%, so that the thin film transistor B has a breakdown voltage of 78V.

As described above, the ELA crystallization can be performed once by scanning the laser beam on the pixel portion and the driver portion with different scan pitches, respectively. Therefore, the driver portion and the pixel portion can be formed to have different grain sizes and surface roughness of the polycrystalline silicon layer. Accordingly, the whole fabricating process is simplified.

According to an exemplary embodiment of the present invention, a driver portion and a pixel portion are scanned by a laser beam at different scan pitches, so that the different portions can be formed of different grain sizes and surface roughness of a semiconductor layer by performing the ELA once, thereby simplifying a fabricating process.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A method of fabricating a thin film transistor, comprising:
   providing a substrate including a pixel portion and a driver portion;
   forming an amorphous silicon layer on the substrate;
   forming a polycrystalline silicon layer by sequentially scanning a laser beam on the amorphous silicon layer in the pixel portion while moving the laser beam at a first scan pitch;
   forming a polycrystalline silicon layer by sequentially scanning the laser beam on the amorphous silicon layer in the driver portion while moving the laser beam at a second scan pitch smaller than the first scan pitch;
   patterning the polycrystalline silicon layer to form a first semiconductor layer having a first surface roughness in the pixel portion and a second semiconductor layer having a second surface roughness larger than the first surface roughness in the driver portion;
   forming a gate insulating layer on the substrate including the first and second semiconductor layers;
   forming first and second gate electrodes on the gate insulating layer to correspond to the first and second semiconductor layers;
   forming first and second source and drain regions by implanting an impurity ion into the first and second semiconductor layers;
   forming an interlayer insulating layer on the substrate including the first and second gate electrodes; and
   forming first and second source and drain electrodes on the interlayer insulating layer, the first and second source and drain electrodes being electrically connected with the first and second source and drain regions, respectively.

2. The method according to claim 1, wherein the polycrystalline silicon layer is formed by excimer laser annealing (ELA).

3. The method according to claim 1, wherein the first scan pitch is 1.25~7.5% of a width of the laser beam.

4. The method according to claim 1, wherein a root mean square (RMS) ratio of the first surface roughness to the second surface roughness is 25~90%.

5. The method according to claim 3, wherein the second scan pitch is 10~80% of the first scan pitch.

6. The method according to claim 3, wherein the first scan pitch is 5~30 μm.

7. The method according to claim 5, wherein the second scan pitch is 4~24 μm.

8. The method according to claim 4, wherein the first surface roughness is 18~270 Å.

9. The method according to claim 4, wherein the second surface roughness is 20~300 Å.

10. The method according to claim 1, wherein the first and second scan pitches depend on a stage moving speed divided by an oscillation frequency of the laser beam.

11. A method of fabricating a thin film transistor, comprising:
    providing a substrate including a pixel portion and a driver portion;
    forming an amorphous silicon layer on the substrate;
    crystallizing the amorphous silicon layer disposed above the pixel portion into a first polycrystalline silicon layer having a first surface roughness and crystallizing the amorphous silicon layer disposed above the driver portion into a second polycrystalline silicon layer having a second surface roughness greater than the first surface roughness;
    wherein the amorphous silicon layer disposed above the pixel portion and the driver portion is crystallized into the first and second polycrystalline silicon layers in a one scanning process.

12. The method according to claim 11, wherein the first and second polycrystalline silicon layers are formed by excimer laser annealing (ELA).

13. The method according to claim 11, wherein a root mean square (RMS) ratio of the first surface roughness to the second surface roughness is 25~90%.

14. The method according to claim 11, wherein the first surface roughness is 18~270 Å.

15. The method according to claim 11, wherein the second surface roughness is 20~300 Å.

* * * * *